United States Patent
Faurie et al.

(10) Patent No.: US 8,916,456 B2
(45) Date of Patent: Dec. 23, 2014

(54) GROUP III-V SUBSTRATE MATERIAL WITH PARTICULAR CRYSTALLOGRAPHIC FEATURES

(71) Applicants: Jean-Pierre Faurie, Valbonne (FR); Bernard Beaumont, Le Tignet (FR)

(72) Inventors: Jean-Pierre Faurie, Valbonne (FR); Bernard Beaumont, Le Tignet (FR)

(73) Assignee: Saint-Gobain Cristaux et Detecteurs, Courbevoie (FR)

( * ) Notice: Subject to any disclaimer, the term of this patent is extended or adjusted under 35 U.S.C. 154(b) by 0 days.

(21) Appl. No.: 13/630,858

(22) Filed: Sep. 28, 2012

(65) Prior Publication Data

US 2013/0082279 A1 Apr. 4, 2013

Related U.S. Application Data

(60) Provisional application No. 61/541,334, filed on Sep. 30, 2011.

(51) Int. Cl.

| | | |
|---|---|---|
| H01L 21/20 | (2006.01) | |
| H01L 21/324 | (2006.01) | |
| H01L 29/20 | (2006.01) | |
| H01L 21/02 | (2006.01) | |
| H01L 29/04 | (2006.01) | |
| H01L 33/00 | (2010.01) | |
| H01S 5/02 | (2006.01) | |
| H01S 5/323 | (2006.01) | |
| H01S 5/32 | (2006.01) | |
| H01L 33/16 | (2010.01) | |

(52) U.S. Cl.
CPC ......... *H01L 21/3245* (2013.01); *H01L 33/0079* (2013.01); *H01L 29/2003* (2013.01); *H01S 5/0206* (2013.01); *H01S 5/32341* (2013.01); *H01S 5/3202* (2013.01); *H01L 33/0075* (2013.01); *H01L 33/16* (2013.01); *H01L 21/02002* (2013.01); *H01L 29/045* (2013.01)
USPC .............. 438/483; 438/460; 257/76; 257/615

(58) Field of Classification Search
USPC ............................. 257/76, 615; 438/460, 483
See application file for complete search history.

(56) References Cited

U.S. PATENT DOCUMENTS

| | | |
|---|---|---|
| 5,700,179 A | 12/1997 | Hasegawa et al. |
| 5,800,725 A | 9/1998 | Kato et al. |
| 5,942,445 A | 8/1999 | Kato et al. |
| 6,413,627 B1 | 7/2002 | Motoki et al. |
| 6,442,975 B1 | 9/2002 | Murakami et al. |
| 6,447,604 B1 | 9/2002 | Flynn et al. |
| 6,489,636 B1 | 12/2002 | Goetz et al. |
| 6,583,050 B2 | 6/2003 | Wenski et al. |
| 6,902,616 B1 * | 6/2005 | Yamazaki et al. ................ 117/3 |

(Continued)

OTHER PUBLICATIONS

International Search Report for PCT/US2012/057931 dated Mar. 26, 2013, 4 pgs.

(Continued)

*Primary Examiner* — David Vu
*Assistant Examiner* — Brandon Fox
(74) *Attorney, Agent, or Firm* — Abel Law Group, LLP; Robert N. Young

(57) ABSTRACT

A substrate including a body comprising a Group III-V material and having an upper surface, the body comprising an offcut angle defined between the upper surface and a crystallographic reference plane, and the body further having an offcut angle variation of not greater than about 0.6 degrees.

20 Claims, 5 Drawing Sheets

(56) References Cited

U.S. PATENT DOCUMENTS

| | | |
|---|---|---|
| 7,057,204 B2 | 6/2006 | Shibata |
| 7,253,499 B2 | 8/2007 | Shibata |
| 7,405,430 B2 | 7/2008 | Saxler et al. |
| 7,411,273 B2 * | 8/2008 | Matsumoto .................. 257/618 |
| 7,723,709 B2 | 5/2010 | Zama et al. |
| 7,828,628 B2 | 11/2010 | Aoki et al. |
| 7,915,152 B2 | 3/2011 | Vaudo et al. |
| 8,158,497 B2 | 4/2012 | Hirai et al. |
| 2006/0043419 A1 | 3/2006 | Tachibana et al. |
| 2008/0224268 A1 | 9/2008 | Abe et al. |
| 2008/0308906 A1 | 12/2008 | Osada et al. |
| 2009/0135873 A1 | 5/2009 | Matsushita et al. |
| 2010/0220761 A1 | 9/2010 | Enya et al. |
| 2011/0006397 A1 | 1/2011 | Fujikura et al. |
| 2011/0092052 A1 * | 4/2011 | Ueno ........................... 438/460 |
| 2011/0237054 A1 | 9/2011 | Iso et al. |
| 2012/0161287 A1 | 6/2012 | Iza et al. |
| 2012/0175739 A1 | 7/2012 | Hirai et al. |
| 2012/0289125 A1 | 11/2012 | Billig et al. |

OTHER PUBLICATIONS

U.S. Appl. No. 14/142,266, filed Dec. 27, 2013, Inventors: Jean-Pierre Faurie, et al.

* cited by examiner

GROUP III-V SUBSTRATE MATERIAL WITH PARTICULAR CRYSTALLOGRAPHIC FEATURES

CROSS-REFERENCE TO RELATED APPLICATION

This application claims priority under 35 U.S.C. §119(e) to U.S. Patent Application No. 61/541,334 entitled "A Group III-V Substrate Material with Particular Crystallographic Features and Methods of Making," by Faurie et al., filed Sep. 30, 2011, which is assigned to the current assignee hereof and incorporated herein by reference in its entirety.

BACKGROUND

1. Field of the Disclosure

The following is directed to a method of forming a semiconductive substrate, and particularly, methods of shaping substrates and improve devices formed from such substrates.

2. Description of the Related Art

Semiconductive-based compounds, including Group III-V materials, such as gallium nitride (GaN), ternary compounds, such as, indium gallium nitride (InGaN) and gallium aluminum nitride (GaAlN), and even the quaternary compounds (AlGaInN) are direct band gap semiconductors. Such materials have been recognized as having great potential for short wavelength emission, and thus suitable for use in the manufacturing of light emitting diodes (LEDs), laser diodes (LDs), UV detectors, and high-temperature electronics devices.

However, the development of such semiconductive materials has been hampered by difficulties surrounding the processing of such materials, particularly the formation of high-quality single crystalline forms of the material, which are required for manufacturing of short wavelength emission in optoelectronics. GaN is not found as a naturally occurring compound, and thus cannot be melted and pulled from a boule like silicon, gallium arsenide, or sapphire, because at usual pressures its theoretical melting temperature exceeds its dissociation temperature. As an alternative, the industry has turned to formation of bulk GaN crystals using epitaxial growth processes. However, problems still remain with the epitaxial approach, including the formation of suitable low defect density bulk GaN material and the existence of other crystalline morphological differences, including crystalline bow.

The existence of extended defects (threading dislocations, stacking faults, and antiphase boundaries) leads to significantly deteriorated performances and results in a shortened operating lifetime of devices. More specifically, the dislocations behave as non-radiative centers, thus reducing the light-emitting efficiency of light-emitting diodes and laser diodes made from these materials. Furthermore, other factors, such as the crystalline orientation can negatively impact the performance of devices formed on the GaN material.

SUMMARY

According to one aspect, a method of forming a substrate includes providing a body comprising a Group III-V material, the body having an upper surface and a rear surface opposite the upper surface and shaping the body to change a physical bow of the body and a crystallographic bow of the body.

According to another aspect, a production lot of substrates includes at least 20 substrates, each of the substrates in the lot comprising a body including a Group III-V material and having an upper surface, the body comprising an offcut angle ($\alpha$) defined between the upper surface and a crystallographic reference plane, the body further comprising an offcut angle variation ($2\beta$) of not greater than about 0.6 degrees.

In still another aspect, a substrate includes a body comprising a Group III-V material and having an upper surface, the body comprising an offcut angle ($\alpha$) defined between the upper surface and a crystallographic reference plane, the body further comprising an offcut angle variation ($2\beta$) of not greater than about 0.6 degrees.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

The following is generally directed to substrate materials, and particular, substrates made of a semiconductor material, which can be used in fabrication of electronic devices. More particularly, substrates of the embodiments herein may be used in the formation of light emitting diodes (LEDs) or laser diodes (LDs). The substrates of the embodiment can include a Group III-V material including for example gallium nitride (GaN). It will be appreciated that reference to Group III-V materials, include compounds having at least one element from Group III of the Periodic Table of Elements and at least one element from Group V of the Periodic Table of Elements.

Figure 1:
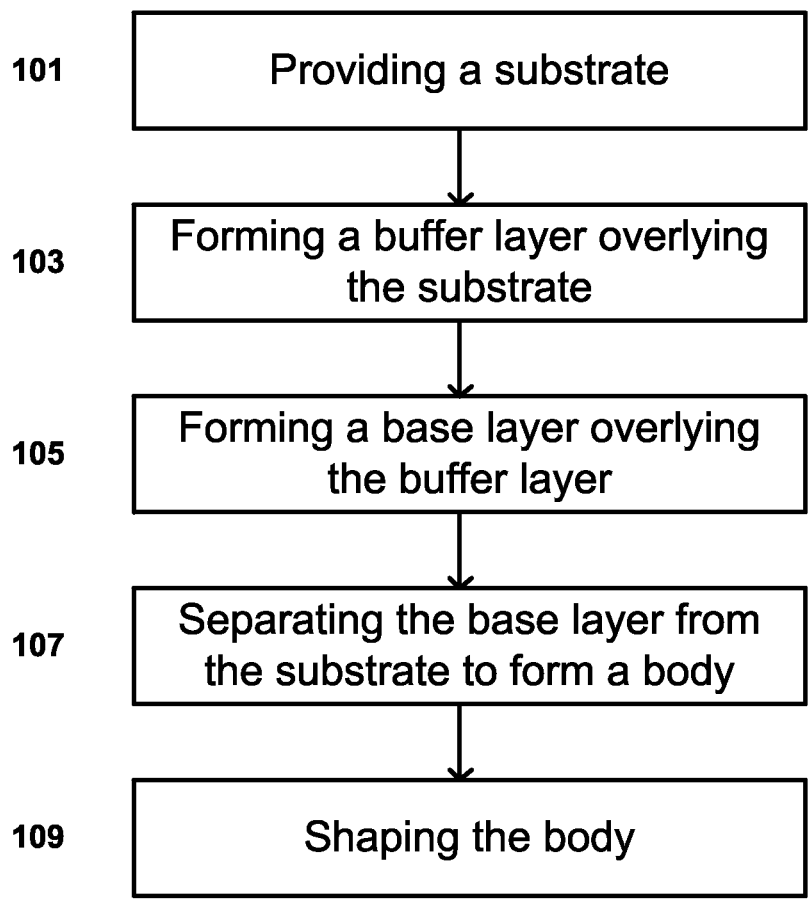
FIG. 1 includes a flowchart providing a method of forming a semiconductive substrate material for use in forming an electronic device in accordance with embodiment.

FIG. 1 includes a flow chart illustrating a method for forming a semiconductor substrate comprising a semiconductor material suitable for fabrication of electronic devices thereon in accordance with the embodiment. As illustrated, the process can be initiated at step 101 by providing a substrate, also referred to as a template substrate. The template substrate can be a structure suitable for supporting a plurality of layers formed thereon, and function as a heteroepitaxial support structure for the formation of a plurality of layers thereon.

In accordance with one embodiment, the template substrate can be an inorganic material. Some suitable inorganic materials can include oxides, carbides, nitrides, borides, oxycarbides, oxyborides, oxynitrides, and a combination thereof. In certain instances the template substrate can include alumina, and more particularly, may include single crystal alumina (i.e., sapphire). One embodiment utilizes a substrate consisting essentially of sapphire.

Figure 2A:
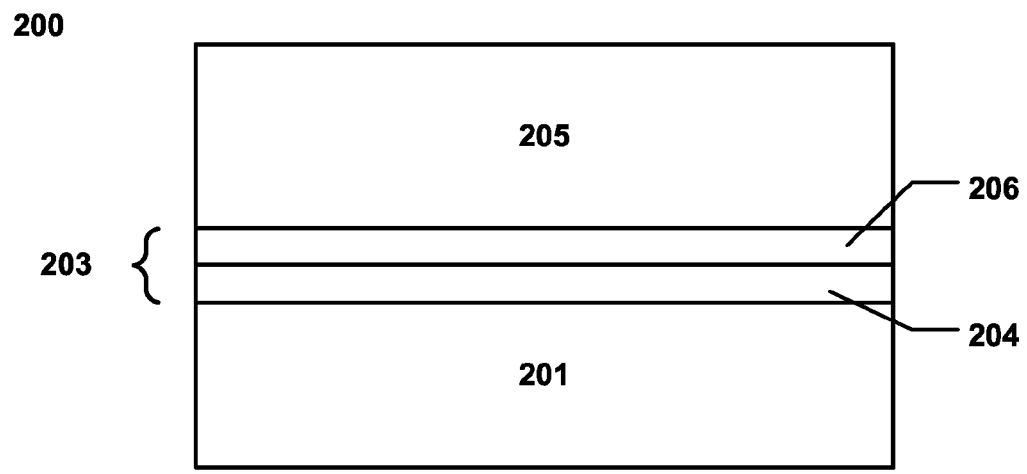
FIG. 2A includes a cross-sectional illustration of the layers formed during formation of a semiconductive substrate in accordance with an embodiment.

The process can continue at step 103 by forming a buffer layer overlying the substrate. Turning briefly to FIG. 2A, a semiconductor substrate 200 is illustrated in accordance with embodiment. Notably, the semiconductor substrate 200 can include a substrate 201 (i.e., template substrate) and a buffer layer 203 overlying the substrate 201. In particular, the buffer layer 203 can overlie an upper major surface of the substrate 201, and more particularly, the buffer layer 203 can be in direct contact with the upper major surface of the substrate 201.

Forming the buffer layer 203 can include a deposition process. For example, the substrate can be loaded into a reaction chamber, and after providing a suitable environment within the reaction chamber, a buffer layer can be deposited on the substrate. According to one embodiment, a suitable deposition technique can include chemical vapor deposition. In one particular instance, the deposition process can include metal-organic chemical vapor deposition (MOCVD).

The buffer layer 203 may be formed from a plurality of films. For example, as illustrated in FIG. 2A, the buffer layer 203 can include a film 204 and a film 206. In accordance with an embodiment, at least one of the films, can include a crystalline material. In more particular instances, the film 204, which can be in direct contact with the surface of the substrate 201, can include silicon, and may consist essentially of silicon. The film 204 may facilitate separation between the substrate 201 and semiconductor layers overlying the film 204 as described herein.

As illustrated in FIG. 2A, the film 206 can overly, and more particularly, can be in direct contact with the film 204. The film 206 can have suitable crystallographic features for epitaxial formation of subsequent layers formed thereon. Notably, in one embodiment, the film 206 can include a semiconductor material. Suitable semiconductor materials can include a Group III-V compound material. In one particular instance, the film 206 can include a nitride material. In another example, the film 206 can include gallium, aluminum, indium, and a combination thereof. Still, in one particular embodiment, the film 206 can comprise aluminum nitride, and more particularly, the film 206 can consist essentially of aluminum nitride.

In an exemplary structure, the buffer layer 203 can be formed such that the film 204 includes silicon and is directly contacting a major surface of the substrate 201. Furthermore, the film 206 can directly contact a surface of the film 204 and include a Group III-V material.

After forming a buffer layer at step 103, the process can continue at step 105 by forming a base layer overlying the buffer layer 203. Referring briefly to FIG. 2A, the semiconductor substrate 200 can include a base layer 205 overlying the buffer layer 203. In particular, the base layer 205 can be formed such it is overlying a surface of the buffer layer 203, and more particularly, the base layer can be in direct contact with the film 206 of the buffer layer 203.

It will also be appreciated that the formation of semiconductor substrates according to embodiments herein may be achieved without necessarily creating a mask or modifying the surface of the substrate via grooving or roughening, or utilization of etching techniques.

According to an embodiment, upon suitably forming a buffer layer 203, the substrate 201 and buffer layer 203 may be placed within a reaction chamber to conduct an epitaxial growth process. The base layer 205 can be formed through an epitaxial growth process, such as hydride vapor phase epitaxy (HYPE). In one particular instance, the base layer 205 can be made of a Group III-V material. Some suitable Group III-V materials can include nitride materials. Furthermore, the base layer 205 may include gallium. In particular instances, the base layer 205 may include gallium nitride (GaN), and more particularly, may consist essentially of gallium nitride.

Particular methods of forming the base layer 205 can be undertaken. For example, the epitaxial growth of the base layer 205 can be conducted in various growth modes, wherein a lower region of the base layer 205 can be grown in a first mode, and an upper region of the base layer 205 can be grown in a second mode different than the first mode. For example, in one embodiment the base layer 205 can be initially formed as an epitaxial layer grown in a 3-dimensional (3D) growth mode, such that the lower region of the base layer 205 may be formed in the 3D growth mode. A 3D growth mode can include the simultaneous growth of the base layer 205 material along multiple crystallographic directions. A 3D growth process can include spontaneous formation of island features on the buffer layer 203. The spontaneously formed island features can be randomly positioned on the buffer layer 203, defining various mesas having multiple facets and valleys between the mesas.

Alternatively, or additionally, the base layer 205 can be formed using a 2 dimensional (2D) epitaxial growth mode. A 2D growth mode is characterized by preferential growth of the material in one crystallographic plane and limited growth of the crystalline material along other crystallographic directions. For example, in one embodiment, formation of a base layer 205 comprising GaN in a 2D growth mode includes preferential growth of the GaN in the c-plane (0001).

As indicated above, the base layer 205 can be formed using a combination of 3D and 2D growth modes. For example, the lower region of the base layer 205 may be initially formed in a 3D growth mode, wherein island features are spontaneously formed and randomly arranged on the buffer layer 203 as a non-continuous layer of material. However if the 3D mode growth is pursued the layer becomes continuous, exhibiting a faceted aspect and a substantially non-uniform thickness. Following the 3D growth mode, growth parameters can be altered to change to a 2D growth mode, wherein lateral growth is favored and thickness uniformity improved. In this manner, the upper region of the base layer 205 can be formed through a 2D growth mode. Combining 3D and 2D growth modes can facilitate reduction of the dislocation density of the base layer 205 and altering (e.g., increasing) the internal strain on the base layer 205.

It will be appreciated that formation of the base layer 205 can include multiple changes in growth modes. For example, in one embodiment, the base layer can be formed by an initial 3D growth mode, followed by a 2D growth mode, and further growth in a 3D growth mode.

Switching between growth modes may be completed by modification of certain growth parameters including growth temperature, growth rate, pressure of vapor phase reactant and non-reactant materials, ratio of reactant and non-reactant materials in the reaction atmosphere, growth chamber pressure, and a combination thereof. Reference herein to a reactant material includes reactant materials such as nitrogen-containing materials, such as ammonia. Other reactant materials can include halide phase components, including for example, metal halide components such as gallium chloride. Non-reactant materials can include certain types of gases, including for example, noble gases, inert gases, and the like.

In particular instances the non-reactant material can include gases such as nitrogen and or hydrogen.

For certain processes, the growth temperature may be changed to facilitate a change between 3D and 2D growth modes. In one embodiment, change of the growth temperature can include an increase in the growth temperature to change from a 3D to a 2D growth mode. For example, in changing from a 3D to a 2D growth mode, the temperature may be changed by at least about 5° C., such as at least about 10° C., at least about 15° C., at least about 20° C., at least about 30° C., at least about 35° C., or even at least about 40° C. In still other embodiments, in changing from a 3D to a 2D growth mode, the growth temperature can be changed by not greater than about 100° C., such as not greater than about 90° C., not greater than about 80° C., not greater than about 70° C., or even not greater than about 60° C. It will be appreciated that the change in growth temperature can be within a range between any of the minimum and maximum values noted above.

In accordance with embodiment, the process of forming the base layer 205 can be conducted at a growth rate of at least 50 microns per hour (microns/hr). In other embodiments, the rate of forming the base layer 205 can be greater, such as at least about 75 micron per hours, at least about 100 microns per hour, at least about 150 microns per hour, at least about 200 microns per hour, or even at least about 250 microns per hour. In another embodiment, the process of forming the base layer 205 can be conducted at a rate of not greater than about 1 mm per hour, such as not greater than 750 microns per hour not great 500 microns per hour, or even not greater than about 300 microns per hour. It will be appreciated the process of forming the base layer can be constructed at a rate within a range within any of the minimum maximum values noted above.

For certain processes, the growth rate may be changed to facilitate a change between 3D and 2D growth modes. For example, the growth rate can be decreased in changing from a 3D to a 2D growth mode. In particular, changing from 3D to 2D growth can include altering the growth rate by at least about 5 microns per hour (i.e., microns/hr). In still other embodiments, in changing from a 3D to a 2D growth mode, the growth rate can be changed by not greater than about 200 microns per hour. It will be appreciated that the change in growth rate can be within a range between any of the minimum and maximum values noted above. It will be appreciated that the change in growth rate can be a decrease in the growth rate when changing from a 3D to a 2D growth mode.

According to other embodiments, the process of changing from 3D to 2D growth modes may be induced by a change in growth rate by at least a factor of 2. For example, the growth rate can be decreased by a factor of at least 2 in changing from a 3D growth mode to a 2D growth mode. In other embodiments, the growth rate can be decreased by a factor of at least about 3, at least about 4, or even at least about 5. In particular instances, the decrease in the growth rate is not greater than about a factor of 8, not greater than a factor of about 7, or not greater than a factor of about 6.

It will be appreciated that in changing the growth mode, one or more of the above-identified factors can be changed. For example, the growth temperature can be changed, while the growth rate is held steady. Alternatively, the growth rate can be changed while the growth temperature is maintained. And still, in another embodiment, both the growth rate and growth temperature may be changed to effectuate the change in growth modes.

After suitably forming the base layer 205, the average thickness of the base layer 205 can be sufficiently thick to support itself and provide a suitable substrate surface for the formation of electronic devices thereon after certain post-formation shaping processes. For example, the average thickness of the base layer 205 can be not greater than about 5 mm, such as not greater than about 4 mm, not greater than 3 mm, not greater than about 2 mm, or even not greater than about 1.5 mm. Still, it will be appreciated that the base layer 205 can be formed such as that it has an average thickness of at least about 0.1 mm, such at least 0.2 mm, at least 0.5 mm, at least 0.8 mm, or even at least 1 mm. It will be appreciated that the base layer 205 can have an average thickness within a range of any of the minimum of maximum values noted above, including for example, within a range between 0.1 mm and about 5 mm.

The base layer 205 can be formed to have a particular dislocation density. The dislocation density of the base layer 205 can be measured at the upper surface of the base layer upon forming. A suitable method of measuring the dislocation density includes use of cathodoluminescence microscopy operated at room temperature and polychromatic light detection without monochromator under 10 keV e-beam, spot size 70, wherein the machine is an SEM JSM-5510, commercially available from JEOL Corporation. For a dislocation density measurement of approximately $10^8$ cm$^{-2}$, the magnification is 4000× and the area is typically 700 μm$^2$. For a dislocation density measurement of approximately $10^6$ cm$^{-2}$, the magnification is typically 500-1000× and the area is typically 0.1 mm$^2$.

According to one embodiment, the base layer 205 can have a dislocation density of not greater than about $1\times10^8$ dislocation/cm$^2$, as measured at an upper surface of the base layer 205. In other embodiments, the dislocation density of the base layer 205 can be less, such that it is not greater than about $1\times10^7$ dislocation/cm$^2$, not greater than about $6\times10^6$ dislocation/cm$^2$, or even not greater than about $1\times10^6$ dislocation/cm$^2$. Still, the base layer 205 may have a dislocation density that is at least about $1\times10^5$ dislocation/cm$^2$, such as at least $2\times10^5$ dislocation/cm$^2$, at least $3\times10^5$ dislocation/cm$^2$, or even at least $5\times10^5$ dislocation/cm$^2$. It will be appreciated that the base layer can have a dislocation density within a range within any of the minimum and maximum values noted above.

During the process of formation of the semiconductive layers, including for example, the base layer 205, the substrate 201 may be separated from the base layer 205. The separation can be facilitated by the dissociation of a portion of the buffer layer 203, and particularly, a film within the buffer layer 203. In accordance with an embodiment, the buffer layer 203 can include a film, such as silicon, wherein at elevated temperatures utilized during the continuous growth process, the film is thermally dissociated. Thermal dissociation facilitates separation between the substrate 201 and the plurality of semiconductive layers. Accordingly, upon completion of the growth process, the base layer 205 can be completely removed from the substrate 201.

Figure 2B:
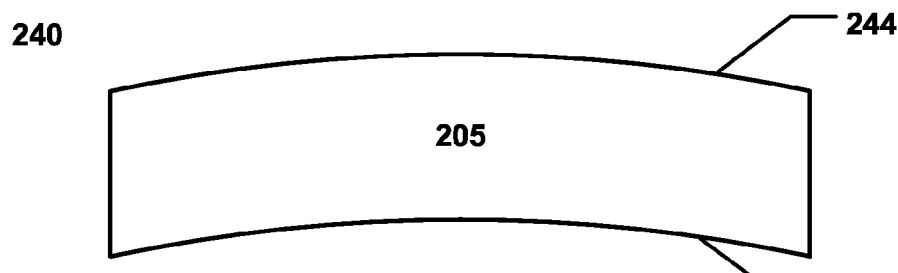
FIG. 2B includes a cross-sectional illustration of a free-standing substrate formed from the semiconductive substrate that includes a body having a concave curvature in accordance with an embodiment.
Figure 2C:
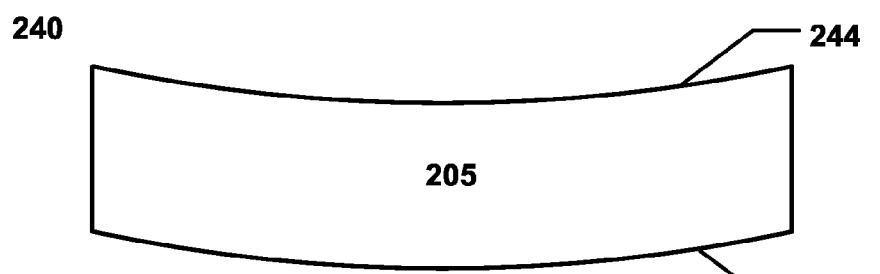
FIG. 2C includes a cross-sectional illustration of a free-standing substrate formed from the semiconductive substrate that includes a body having a convex curvature in accordance with an embodiment.

After separating the substrate 201 from the base layer 205, a free-standing substrate is formed of the material of the base layer 205. The free-standing substrate can have a body 240, which may have a curvature or bow. In particular instances, the body 240 can have an upper surface 244 representing a Ga-face and a rear surface 246 representing a N-face, and the body 240 can have a concave curvature, based upon the curvature of the rear surface 246, such as the body illustrated in FIG. 2B. In other instances, the body 240 can have an upper surface 244 representing a Ga-face and a rear surface 246 representing a N-face, and the body 240 can have a convex curvature, based upon the curvature of the rear surface 246, such as the body illustrated in FIG. 2C.

According to one embodiment, shaping includes changing a physical bow of the body and a crystallographic bow of the body. Shaping can include a process to change the physical curvature of the body, such that a particular aspect of crystallographic orientation (e.g., offcut angle variation) between the upper surface 244 of the body and a crystallographic reference plane is modified. For example, shaping can include application of a force on the body in a manner to reduce the bow of the body. The force can be used to compress or deflect the body. In one particular aspect, the process of shaping can include the application of an axial force on the body. The axial force can be applied to the body in a direction substantially perpendicular to an axial plane defining the diameter of the body. Moreover, in certain instances, the axial force can be applied to the body in a direction substantially perpendicular to a plane defined by the upper surface.

According to one embodiment, the axial force used to deflect and flatten the body can be dependent upon the diameter of the body, the thickness of the body, the degree of physical bow of the body, and a combination thereof. According to one embodiment, the axial force applied can be at least about 5 N, such as at least about 10 N, at least about 15 N, at least about 20 N, or even at least about 25 N. In other instances, the axial force can be not greater than about 1000 N, such as not greater than about 900 N, not greater than about 850 N, or even not greater than about 800 N. It will be appreciated that the axial force used during shaping can be within a range including any of the above identified minimum and maximum values.

In particular instances, the force applied to the body during shaping can be an axial force preferentially located to a center portion or a peripheral portion of the body. Preferential application of a force includes the application of a greater force at one location, portion, or area of the body than another area of the body. More particularly, preferential application of a force to a portion of the body can be based on the curvature of the body. That is, in one embodiment, an axial force can be preferentially applied to the body in a central portion of the body having a concave curvature. Alternatively, an axial force may be preferentially applied to a peripheral portion of the body, wherein the body comprises a convex curvature.

In one embodiment, an axial force may be applied preferentially to a center portion of the body, such that the majority of the force applied to the body is within an area on the surface of the body defined by half of the radius or less. In more particular instances, the force applied in the central portion can be at least about 60% of the total force applied to the body, at least about 70% of the total force, at least about 80% of the total force, at least about 90% of the total force, or essentially all of the force applied to the body.

In another embodiment, shaping can include preferential application of a force to the body in a peripheral portion of the body, wherein the peripheral portion is defined by an area on the surface in the form of a ring extending from a circumference of half of the radius out to the edge of the body between the upper surface and the side surface (i.e., the circumference at the full radius of the body). The force applied in the peripheral portion can be a majority of the force, at least about 60% of the total force applied to the body, at least about 70% of the total force, at least about 80% of the total force, at least about 90% of the total force, or essentially all of the force applied to the body.

The shaping process can further include binding the body to a flattened position. In one particular embodiment, the binding the body to a flattened position can be used in conjunction with the application of a force, such that the bow of the body can be changed until the body is in a flattened position, and then maintained in a flattened position via binding. In one particular embodiment, binding can include attaching the body to a shaping platen while applying a force to the body and changing the physical bow and crystallographic bow of the body.

Furthermore, binding the body in a flattened position can incorporate a binding material. For example, binding can include adhering the body to a shaping platen using a binding material. The binding material can be used to temporarily hold the body in a flattened position. For example, the binding material can be used to removably couple the body to a shaping platen while applying a force to the body.

The binding can include an organic material. For example, suitable organic materials can include natural or synthetic organic materials, including polymers or a wax material.

According to one embodiment, shaping can include the application of heat. For example, shaping can include heating the body to facilitate changing the physical bow and crystallographic bow. Furthermore, shaping can include the application of heat to facilitate the use of a binding material. In one embodiment, the binding material can be heated to a temperature sufficient to facilitate a phase change in the binding material, including for example, a change from a solid state to a liquid state. Furthermore, in a more particular embodiment, shaping may further include cooling of the body and the binding material to facilitate a second phase change in the binding material, including for example, solidification of the binding material from a liquid state to a solid state, which can facilitate binding and maintaining the body in a flattened position, particularly against the shaping platen.

According to one embodiment, shaping can include heating at a temperature of at least about 40° C., such as at least about 50° C., at least about 60° C., at least about 70° C., at least about 80° C., or even at least about 90° C. Still, in other instances, shaping can include heating at a temperature of not greater than about 300° C., such as not greater than about 200° C., or not greater than about 100° C.

Alternatively, the shaping process can include compressing the body. For example, the body can be compressed between an upper platen coupled to the upper surface of the body and a lower platen coupled to the rear surface of the body. The body may be adhered, via a binding material, to the upper platen and/or the lower platen during compression. That is, a binding material can be applied at the interface between the upper surface and the upper platen and the rear surface and the lower platen. It will be appreciated, that the binding material can be a material facilitating removable coupling between a platen and the body, wherein features and characteristics of the body are not necessarily altered by use of the binding material.

In particular instances, the shaping process can reduce the physical bow (h) of the body by at least 10%, wherein bow is measured as the difference: $zC-0.25\times(zS+zN+zE+zW)$, where $zC$ is the height of a point located in the center of the body of the free-standing substrate, and the notations $zS$, $zN$, $zE$ and $zW$ represent the height of the four points located at 24 mm from the center point of a 2-inch substrate and regularly spaced by 90° around the center point. The height is measured along an axis z essentially perpendicular to the surface of the body in its center. The bow value (h) can be very small compared to the substrate diameter (d), the perpendicular direction can be the normal to a reference plane of the measurement tool on which the substrate is laying. For substrates of various diameters, the four points away from the center used to measure the bow can be located at a distance of at least about 90%, and preferably at a distance equal to 95% of the dimension of the radius from the center of the body. For example, the 4 points on the ring will be located at 48 mm on a substrate body having a diameter of 4 inches. The relation between the bow (h) the diameter of the substrate body (d), and the physical radius of curvature ($\rho$) can be defined by $\rho=d^2/8h$.

The reduction in the bow can be measured by the equation $\Delta Bow=[(h_1-h_2)/h_2)]$, wherein $h_1$ is a bow of the body before shaping and $h_2$ is a bow of the wafer after shaping. In other embodiments, depending upon the initial bow of the body, the reduction in the bow can be greater, such as at least about 15%, at least about 20%, at least about 25%, at least about 30%, at least about 40%, at least about 50%, at least about 75%, at least about 90% or even at least about 95%.

Figure 3A:
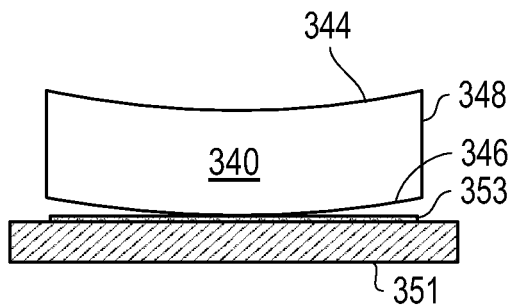
FIGS. 3A-3C include cross-sectional illustrations of a shaping process according to one embodiment.
Figure 3B:
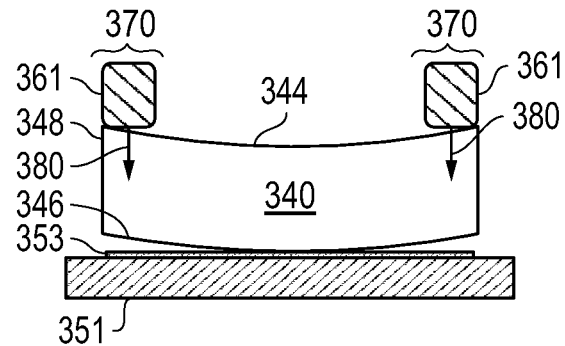
Figure 3C:
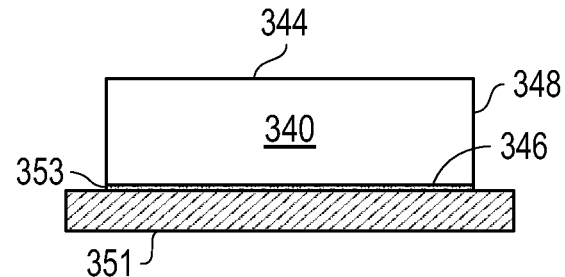

FIGS. 3A-3C include cross-sectional illustrations of a shaping process according to one embodiment. As illustrated in FIG. 3A, a body 340 in the form of a free-standing substrate, formed according to the methods described herein, can have an upper surface 344, a rear surface 346 opposite the upper surface 344, and a side surface 348 joining the upper surface 344 and the rear surface 346. The body 340 can have a convex curvature as defined by the rear surface 346. Moreover, the body can have a physical curvature as illustrated, and a curvature of the internal crystalline structure.

The body 340 can be placed on a shaping platen 351, which can include a layer of binding material 353, such as wax. According to a particular embodiment, the binding material 353 and shaping platen 351 can be heated to a temperature, wherein the binding material can be in a liquid phase, and the body 340 placed in the binding material on the platen while the binding material is liquid.

As illustrated in FIG. 3B, an axial force can be applied to the body 340 and particularly at the upper surface 344 by an applicator 361. The applicator 361 can preferentially apply a force, particularly an axial force in the direction 380 as shown, at a peripheral region 370 of the body 340. In particular instances, the applicator 361 can be an annular-shaped object, which may be adjustable capable of expanding and contracting for suitable placement relative to the body and application of an axial force 380 within a desired region of the body.

The axial force can be applied to deflect the body 340 and change the physical bow of the body and a crystalline bow of the body 340 to a flattened state as illustrated in FIG. 3C. Upon shaping the body 340 to the flattened state as illustrated in FIG. 3C, the shaping platen 351 and binding material 353 can be cooled, such that the binding material 353 changes phase from a liquid to a solid, which facilitates holding the body 340 to the shaping platen 351 and maintaining the flattened state of the body 340.

Notably, the shaping process can be conducted such that the rear surface 346 is the N-face of the Group-III nitride material (e.g., GaN). For the purposes of the shaping process, the N-face can be the surface coupled to the shaping platen 351 and utilized as a reference plane, since upon initially forming the body through an epitaxial process, the N-face defined by the rear surface 346 comprises the desired crystalline orientation, which the shaping process is intended to return the body to.

Figure 4A:
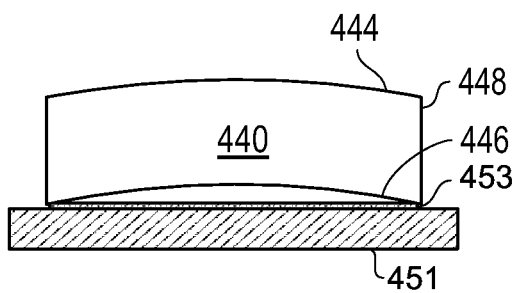
FIGS. 4A-4C include cross-sectional illustrations of a shaping process according to one embodiment.
Figure 4B:
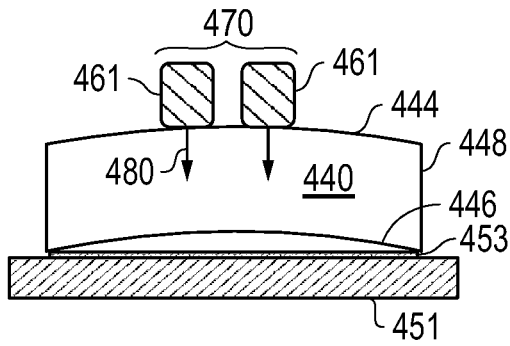
Figure 4C:
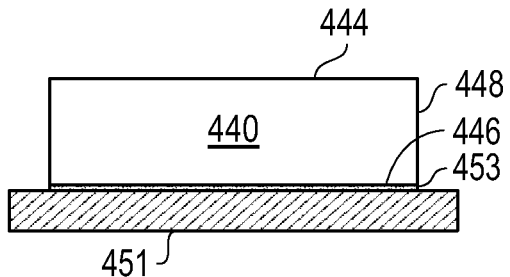

FIGS. 4A-4C include cross-sectional illustrations of a shaping process according to another embodiment. Notably, as illustrated in FIG. 4A, the body 440 can be a free-standing substrate, formed according to the methods described herein, and having an upper surface 444, a rear surface 446 opposite the upper surface 444, and a side surface 448 joining the upper surface 444 and the rear surface 446. The body 440 can have a concave curvature as defined by the rear surface 446. Moreover, the body 440 can have a physical curvature as illustrated, and a curvature of the internal crystalline structure.

The body 440 can be placed on a shaping platen 451, which can include a layer of binding material 453, such as wax. According to a particular embodiment, the binding material 453 and shaping platen 451 can be heated to a temperature wherein the binding material 453 can be in a liquid phase, and the body 440 placed in the binding material 453 on the shaping platen 451 while the binding material 453 is liquid. The process of shaping the body 440 can be essentially the same as described herein in conjunction with FIGS. 3A-3C, with the exception that an axial force 480 can be applied to the body 440, and particularly at the upper surface 444 by an applicator 461, wherein the applicator 461 can preferentially apply the axial force at a central region 470 of the body 440.

The axial force can be applied to deflect the body 440 and change the physical bow of the body 440 and a crystalline bow of the body 440 to a flattened state as illustrated in FIG. 4C. Upon shaping the body 440 to the flattened state, the shaping platen 451 and binding material 453 can be cooled, such that the binding material 453 changes phase from a liquid to a solid, which facilitates holding the body 440 to the shaping platen 451 and maintaining the flattened state of the body 440.

Notably, the shaping process illustrated in FIGS. 4A-4C can be conducted such that the rear surface 446 is the N-face of the Group-III nitride material (e.g., GaN). For the purposes of the shaping process, the N-face can be the surface coupled to the shaping platen 451 and utilized as a reference plane, since upon initially forming the body through an epitaxial process, the N-face defined by the rear surface 446 comprises the desired crystalline orientation, which the shaping process is intended to return the body to.

It will be appreciated that after shaping of the body as described herein, the body can undergo a finishing process. Finishing can include suitable material removal processes, including for example, grinding, lapping, polishing and the like to form a free-standing substrate body having suitable geometric characteristics. According to one particular embodiment, the finishing process can include a double-sided process, wherein the body is disposed between two finishing surfaces (e.g., lapping heads, grinding heads, polishing heads, etc.). The double-sided finishing process may further compress the body between the finishing surfaces under an axially compressive load.

Figure 5A:
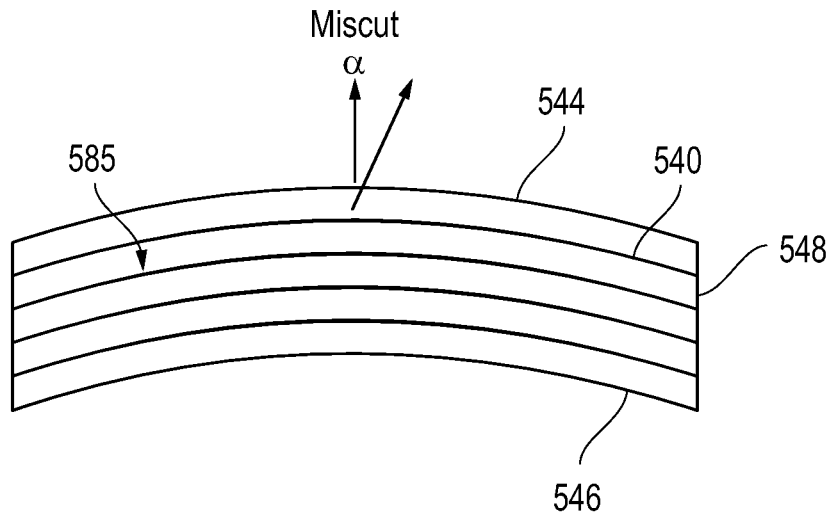
FIGS. 5A and 5B include cross-sectional illustrations of free-standing substrates having bodies characterized by particular crystalline features in accordance with embodiments herein.

FIG. 5A includes a cross-sectional illustration of a body formed according to an embodiment. Notably, FIG. 5A includes a body 540 that can be a free-standing substrate, having an upper surface 544, a rear surface 546 opposite the upper surface 544, and a side surface 548 joining the upper surface 544 and the rear surface 546. The body 540 can have a concave curvature as defined by the rear surface 546. Moreover, as illustrated, the body 540 can have a crystalline bow, wherein the internal crystalline structure 585 is bowed with the curvature of the body 540.

Figure 5B:
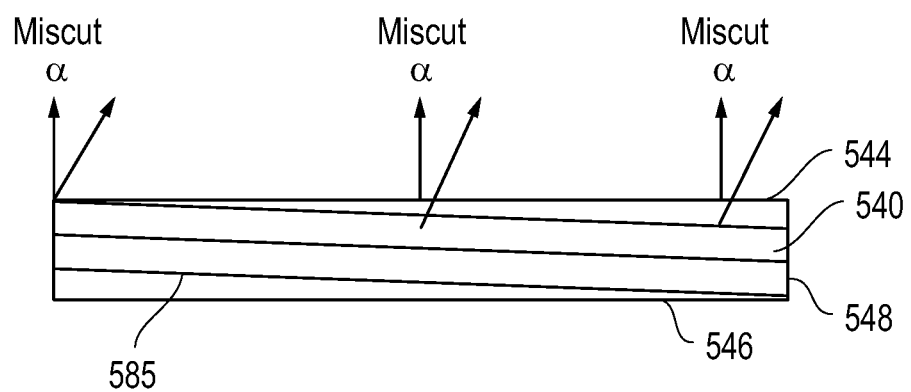

However, after conducting the shaping process according to the embodiments herein, the body can have a crystalline structure as illustrated in FIG. 5B. Notably, the physical bow of the substrate has been reduced and also the crystalline bow of the substrate has been reduced. Accordingly, the variation in particular crystalline properties (e.g., offcut angle variation) across the surfaces 544 and 546 of the body 540 have been modified. In particular, the free-standing substrate body can have particular geometric and crystallographic features as described herein.

Figure 6A:
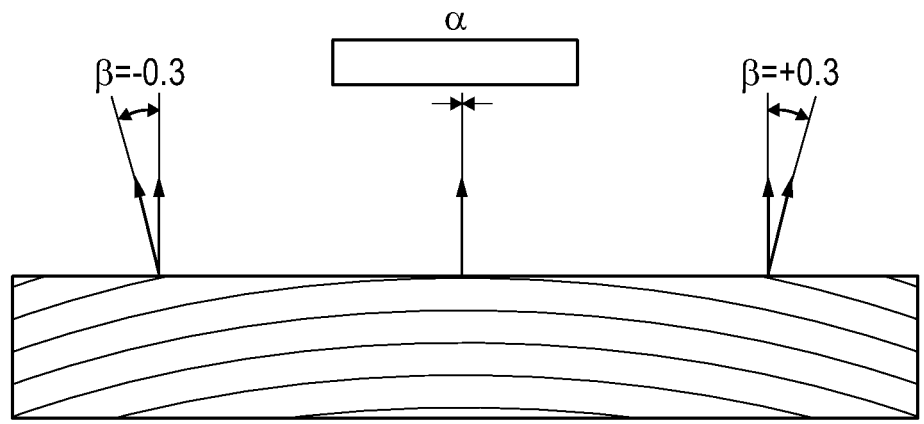
FIGS. 6A and 6B include cross-sectional illustrations of substrate bodies having conventional features and exemplary features, respectively.
Figure 6B:
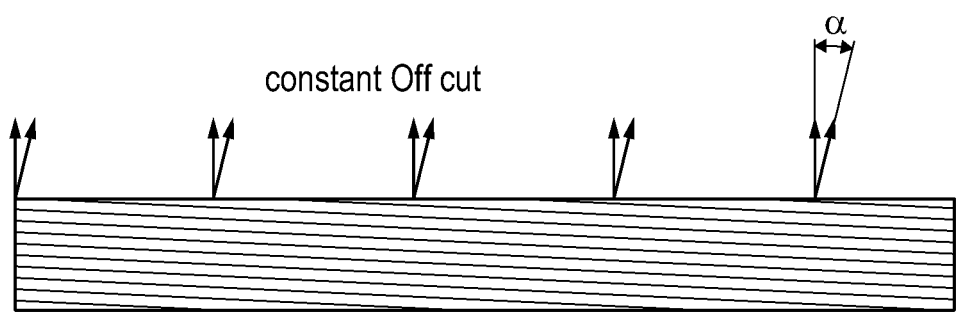

For example, in one embodiment, the body can have a particular offcut angle (α), measured, at the center of the wafer, as the angle between the upper surface 544 and a crystallographic reference plane 585 within the crystalline material. For ease of reference to certain parameters described herein, FIG. 6A includes a cross-sectional illustration of a conventional substrate body formed through conventional means, and FIG. 6B includes a cross-sectional illustration of substrate body formed according to an embodiment herein. As illustrated, the conventional body of FIG. 6A demonstrates significant crystalline bow and little to no physical bow. The evidence of crystalline bow is most apparent in the offcut angle dispersion (β) across the diameter of the wafer varying from −0.3 degrees to +0.3 degrees for an offcut angle variation (2β), of 0.6 degrees. By contrast, and as illustrated in FIG. 6B, the substrate body formed according to the embodiments herein demonstrates little to no physical bow, crystallographic bow, or offcut angle variation.

According to one embodiment, the body can have an offcut angle (α) of not greater than about 2 degrees, such as not greater than about 1.5 degrees, not greater than about 1 degree, not greater than about 0.8 degrees, or even not greater than about 0.6 degrees. Still, the offcut angle (α) can be at least about 0.01 degrees, such as at least about 0.05 degrees, at least about 0.1 degrees, at least about 0.2 degrees, at least about 0.3 degrees or even at least about 0.6 degrees. The offcut angle can be within a range including any of the minimum and maximum values noted above.

It will be appreciated that the offcut angle direction may also be controlled with particularity. For example, the offcut angle direction can be purposefully angled towards the m-plane [1-100] a-plane [11-20], a combination thereof, or any other direction. In accordance with another embodiment, the body can demonstrate a particular offcut angle variation (2β) that is measured via X-Ray diffractometry through using X'Pert Pro PANalytical equipment. Using the X'Pert Pro PANalytical equipment, the offcut angle (α) can be determined by X-ray diffraction using a center point and 4 points separated by 90 degrees and spaced apart at a distance of 22 mm (95% of the dimension of the radius) from the center of the substrate body. The offcut angle variation (2β) along a diameter is calculated based upon the X-ray analysis using the software X'Pert Epitaxy v. 4.2. Generally, the calculations are based upon use of four ω-scans (sometimes also called rocking curves) taken at intervals of φ=90°. A graph with the ω values on Y ordinate and the φ values on X abscissa is displayed. The four values of $ω_o$ (the four maxima peaks corresponding to the four ω-scans) are plotted according to their φ values (for ex. 0°, 90°, 180°, 270°). Then the graph including at least these 4 points is fitted with a sinusoidal function. The function has the equation: ω=A+α*cos(Pi*(φ−C)/180) wherein "A" is a constant (average value of the different measured $ω_o$), "α" is the off-cut value (in degrees), "C" is a φ angle precising the relative direction of the off-cut angle. It will be appreciated that during ω-scan analysis, the detector remains stationary and the sample is rotated about the ω axis.

The offcut angle variation (2β) can be not greater than about 0.6 degrees (β of plus or minus 0.3 degrees), such as not greater than about 0.5 degrees (+/−025 degrees), not greater than about 0.4 degrees, not greater than about 0.3 degrees, not greater than about 0.2 degrees, not greater than about 0.16 degrees, not greater than about 0.14 degrees, or even not greater than about 0.1 degrees, not greater than about 0.08 degrees, or even not greater than about 0.06 degrees. Still, the offcut angle variation across the wafer can be at least about 0.005 degrees or at least about 0.008 degrees. The offcut angle variation can be within a range including any of the minimum and maximum values noted above.

The body can include a Group III-V material, particularly a nitride containing material, and more particularly a gallium containing material. In certain instances, the body can be a free-standing gallium nitride substrate, which can consist essentially of gallium nitride, not including dopant materials.

The body 540 can be formed such that it has an average thickness between the upper surface 544 and the rear surface 546 of at least about 10 microns. In other instances, the average thickness of the body 540 may be greater, such as at least about 20 microns, at least about 30 microns, at least about 40 microns, or even at least about 50 microns. Still, the average thickness of the body 540 may be not greater than about 3 mm, such as not greater about 2 mm, not greater than about 1 mm, not greater than about 800 microns, or even not greater than about 500 microns not greater than about 300 microns, not greater than about 200 microns, or even not greater than about 100 microns. It will be appreciated that the body 540 can have an average thickness within a range between any of the minimum and maximum values noted above.

According to one embodiment, the crystallographic reference plane can be the a-plane, m-plane, or c-plane. More particularly, the crystallographic reference plane can be a c-plane that is tilted toward the a-plane or m-plane. It will be appreciated that the crystallographic reference plane can include various particular planes, including for example, but not limited to, the c and −c polar planes (0002) and (000-2), non-polar planes such as the m-plane family {1-100}, the a-plane family {11-20}, or semi polar planes such as {11-22}, {10-12}, {30-31}, {20-21} or {30-3-1}.

Certain free-standing bodies according to the present embodiments can have a particular physical bow. The bow can be measured as the maximum deviation of the surface from a plane defined as the best least squared fit to the surface of the substrate. That is, for example, the curvature of the body 540 can be notably low, demonstrating substantially little to no bowing. According to one embodiment, the body 540 can have a bow corresponding to a radius of curvature of at least about 1.5 m. In other cases, the bow of the body 540 can correspond to a radius of curvature of at least about 1.8 m, at least about 2 m, at least about 2.5 m, at least about 3 m, at least about 5 m, at least about 10 m, at least about 50 m, at least about 100 m, or even at least about 200 m.

Moreover, the body formed according to the processes of embodiments herein can have a particular total thickness variation (TTV). For example, the TTV can be not greater than about 50 µm, such as not greater than about 20 µm, not greater than about 10 µm, not greater than about 5 µm, or even not greater than about 2 µm. TTV can be measured via standard metrology tool from SygmaTech. Still, in certain instances, the TTV can be at least about 5 µm, such as at least about 10 µm, or at least about 15 µm. It will be appreciated that the body 540 can have a TTV within a range between any of the minimum and maximum values noted above.

Generally, the body 540 can have a disc-like shape defining a particular diameter. For example, the diameter of the body can be at least about 2 inches (5.1 cm), at least about 3 inches (7.6 cm), at least about 10 cm (approximately 4 inches), at least about 15 cm (approximately 6 inches) at least about 20 cm (approximately 8 inches) or even at least about 30 cm (approximately 12 inches).

In one particular aspect of the present embodiments, the body 540 can have an average surface roughness ($R_a$) of the upper surface 544 and/or the rear surface 546 of not greater than about 1 micron, not greater than about 0.1 microns, not greater than about 0.05 microns, not greater than about 0.01 microns, not greater than about 0.001 microns (1 nm) or even not greater than about 0.0001 microns (0.1 nm), for an area of 100×100 μm$^2$.

Notably, the body 540 of the semiconductor substrate can be formed to have a particular crystalline bow. Notably, while the physical bow can be directly measured through metrology, the crystalline bow can be derived from the measurement of the crystalline radius of curvature by X-ray diffraction. The physical bow and the crystalline bow can be the same, and more often, depending upon the finishing process, can be significantly different.

The crystalline bow is measured as the curvature of the crystalline material within the body of the semiconductor substrate as a deviation from a perfectly planar crystalline morphology. A measure of the crystal is performed by X-ray diffraction following methods disclosed in Chapter 4.3.5 in the book "X-ray scattering from semiconductors" by Paul F. Fewster, based on the formula 4.12 for deriving the radius of curvature $\rho=(x_1-x_2)/(\omega 1-\omega 2)$, wherein "ρ" is the radius of curvature, "x" is the position on the sample, and "ω" is the angular position of the maximum of the diffraction peak in ω-scan at this position. That is, for example, the curvature of the body 540 can be notably low, demonstrating substantially little to no bowing. According to one embodiment, the body 540 can have a crystalline bow that is less than about 200 microns. In other instances, the bow can be less, such as not greater than about 100 microns, not greater than about 75 microns, not greater than about 50 microns, not greater than about 25 microns, not greater than about 10 microns or even not greater than about 2 microns. The radius of curvature ρ can be measured via X-Ray diffractometry using X'Pert Pro PANalytical equipment. For a 2-inch diameter wafer the radius of curvature (ρ) is determined from 9 ω-scan peak positions over a range of 40 mm along a diameter.

According to another embodiment, a production lot of free-standing substrates can be formed using the methods of embodiments herein. In particular, a production lot can include at least 20 substrates formed consecutively with respect to each other, which are not necessarily chosen at random from a larger cache of substrates, which were formed using the same process and intended to have the same geometric and crystalline characteristics. For particular embodiments, a production lot of at least 20 substrates can be formed, wherein each of the substrates has those characteristics described herein.

Additionally, the production lot as a whole, can have particular characteristics. For example, the production lot of substrates can have a lot standard deviation of offcut angle that is not greater than about 1 degree. The lot standard deviation of offcut angle can be a standard deviation based on the average offcut angle (α) for each of the substrates in the production lot. That is, for every substrate, an average offcut angle (α) is calculated and a standard deviation is calculated from the average offcut angle calculated for each of the 20 substrates at the center of each substrate. In another embodiment, the production lot comprises a lot standard deviation of offcut angle (STα) of not greater than about 0.05 degrees, not greater than about 0.03 degrees, not greater than about 0.02 degrees, not greater than about 0.01 degrees, not greater than about 0.005 degrees, or not greater than about 0.001 degrees. Still, in certain instances, the lot standard deviation of offcut angle can be at least about 0.0001 degrees or at least about 0.0005 degrees. It will be appreciated that the lot standard deviation of offcut angle can be within a range between any of the minimum and maximum values noted above.

The production lot of substrates can also have a standard deviation of the offcut angle variation (ST2β). The standard deviation of the offcut angle variation (ST2β) for the production lot is the standard deviation of the average offcut angle variation (2β) for each of the 20 substrates in the production lot. That is, for every substrate, the offcut angle variation (2β) can be calculated, and from the average offcut angle variation (2β) for each of the 20 substrates, a standard deviation of the average offcut angle variation (ST2β) can be calculated for the entire production lot. In one embodiment, the production lot can have a lot standard deviation of offcut angle variation of not greater than about 0.1 degrees, not greater than about 0.09 degrees, not greater than about 0.05 degrees, not greater than about 0.03 degrees, not greater than about 0.01 degrees, not greater than about 0.008 degrees, not greater than about 0.005 degrees, or not greater than about 0.001 degrees. Still, in certain instances, the standard deviation of offcut angle variation for the production lot can be at least about 0.0001 degrees or at least about 0.0005 degrees. It will be appreciated that the offcut angle variation of the production lot can be within a range between any of the minimum and maximum values noted above.

It has been noted that the incorporation of certain species, such as indium (In) in semiconducting materials (e.g., GaN) can vary with the off cut angle (α). In fact, as the offcut angle increases the indium incorporation efficiency can decrease. Indium composition in $In_xGa_{1-x}N$ alloys determine the emission wavelength in light emitting as well as in laser diodes structures (LEDs & LDs). According to industry standards, the wavelength variation range should not exceed 2 nm across a wafer and the standard deviation should be less than 1 nm. According to reported results on sapphire substrates a 0.5° in the offcut angle induces a LED wavelength change of 10 nm which is not acceptable for blue LED production. Therefore, in order to control LED light emission wavelength range within 2 nm on the entire wafer, the offcut angle variation across the wafer is controlled to be less than 0.6 degrees (+/−0.3 degrees) independent of the substrate size.

The embodiments herein represent a departure from the state-of-the-art. While certain bulk GaN substrates have been formed, such processes typically involve formation of a free-standing GaN substrate followed by immediate finishing operations. Moreover, while physical bow of GaN substrates has been recognized, the crystalline bow of the substrates, and particularly the offcut angle variation across the diameter of the substrates has not been effectively addressed. The present application discloses a particular process for forming semiconductive substrates using a particular combination of features, including a shaping process having particular parameters. The forming process facilitates the production of free-standing Group III-V substrates having bodies with a particular combination of features, including, but not limited to, offcut angle, offcut angle variation, bow, crystalline bow, TTV, thickness, diameter, surface roughness, crystalline orientation, and the like. Moreover, the processes of embodiments herein have proven useful in forming production lots of substrates having improved dimensional and crystalline properties, including for example, offcut angle deviation and a lot standard deviation of offcut angle variation.

In the foregoing, reference to specific embodiments and the connections of certain components is illustrative. It will be appreciated that reference to components as being coupled or connected is intended to disclose either direct connection between said components or indirect connection through one or more intervening components as will be appreciated to carry out the methods as discussed herein. As such, the above-disclosed subject matter is to be considered illustrative, and not restrictive, and the appended claims are intended to cover all such modifications, enhancements, and other embodiments, which fall within the true scope of the present invention. Thus, to the maximum extent allowed by law, the scope of the present invention is to be determined by the broadest permissible interpretation of the following claims and their equivalents, and shall not be restricted or limited by the foregoing detailed description.

The Abstract of the Disclosure is provided to comply with Patent Law and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all features of any of the disclosed embodiments. Thus, the following claims are incorporated into the Detailed Description, with each claim standing on its own as defining separately claimed subject matter.

What is claimed is:

1. A method of forming a substrate comprising:
providing a body comprising a Group III-V material, the body having an upper surface and a rear surface opposite the upper surface; and
shaping the body to change a physical bow of the body and a crystallographic bow of the body, wherein shaping comprises applying an axial force to the body in a direction perpendicular to a plane defined by the upper surface.

2. The method of claim 1, wherein the axial force is not greater than about 1000 N.

3. The method of claim 2, wherein the axial force is applied preferentially to one of a center portion or peripheral portion of the body depending upon a curvature of the body.

4. The method of claim 1, wherein shaping further comprises binding the body to a flattened position.

5. The method of claim 1, wherein shaping comprises:
heating the body and a binding material to a temperature sufficient to change the binding material to a liquid phase; and
cooling the body after heating to solidify the binding material into a solid phase and bind the body to the platen.

6. The method of claim 1, wherein shaping comprises reducing the bow by at least about 10% based on an equation $\Delta Bow=[(h_1-h_2)/h_1]$, wherein $h_1$ is a bow of the body before shaping and $h_2$ is a bow of the wafer after shaping.

7. The method of claim 1, wherein after shaping, the body comprises an offcut angle defined between the upper surface and a crystallographic reference plane, and wherein after shaping the body comprises an offcut angle variation ($2\beta$) is not greater than about 0.6 degrees (+/−0.3 degrees).

8. The method of claim 4, wherein binding comprises attaching the body to a shaping platen while applying a force to the body to change the physical bow and crystallographic bow of the body.

9. The method of claim 4, wherein binding comprises adhering the body to a shaping platen using a binding material.

10. The method of claim 5, wherein the binding material comprises an organic material.

11. The method of claim 5, wherein the binding material comprises a wax.

12. The method of claim 5, wherein heating the body comprises heating at a temperature of at least about 40° C.

13. A method of forming a substrate comprising:
shaping a body comprising a Group III-V material to change a physical bow of the body and a crystallographic bow of the body, wherein the body has an upper surface and a rear surface opposite the upper surface, and wherein shaping comprises compressing the body.

14. The method of claim 13, wherein compressing the body includes pressing the body between an upper platen coupled to an upper surface and a lower platen coupled to the rear surface.

15. The method of claim 14, wherein shaping comprises adhering the body to a lower platen during compressing the body.

16. The method of claim 15, wherein adhering comprises removably coupling the body to the lower platen.

17. The method of claim 15, wherein adhering comprises placing an adhesive material on the rear surface of the body.

18. The method of claim 13, wherein shaping comprises reducing the bow by at least about 10% based on an equation $\Delta Bow=[(h_1-h_2)/h_1]$, wherein $h_1$ is a bow of the body before shaping and $h_2$ is a bow of the wafer after shaping.

19. The method of claim 13, wherein after shaping, the body comprises an offcut angle defined between the upper surface and a crystallographic reference plane, the offcut angle ($\alpha$) being not greater than about 2 degrees.

20. The method of claim 13, wherein after shaping the body comprises an offcut angle variation ($2\beta$) not greater than about 0.5 degrees (+/−025 degrees).

* * * * *

UNITED STATES PATENT AND TRADEMARK OFFICE
CERTIFICATE OF CORRECTION

PATENT NO. : 8,916,456 B2  
APPLICATION NO. : 13/630858  
DATED : December 23, 2014  
INVENTOR(S) : Jean-Pierre Faurie et al.

Page 1 of 1

It is certified that error appears in the above-identified patent and that said Letters Patent is hereby corrected as shown below:

In the Claims

Claim 12, column 16, line 18, please delete "40° C." and insert --40°C.--  
Claim 20, column 16, line 46, please delete "025 degrees" and insert --0.25 degrees--

Signed and Sealed this  
Tenth Day of November, 2015

Michelle K. Lee  
*Director of the United States Patent and Trademark Office*